(12) United States Patent
Nguyen et al.

(10) Patent No.: US 9,206,512 B2
(45) Date of Patent: Dec. 8, 2015

(54) GAS DISTRIBUTION SYSTEM

(75) Inventors: Hanh D. Nguyen, San Jose, CA (US); Majeed A. Foad, Sunnyvale, CA (US); Dieter Haas, San Jose, CA (US); Karl J. Armstrong, San Jose, CA (US); Xiaoxiong Yuan, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 682 days.

(21) Appl. No.: 13/528,906

(22) Filed: Jun. 21, 2012

(65) Prior Publication Data

US 2012/0325149 A1 Dec. 27, 2012

Related U.S. Application Data

(60) Provisional application No. 61/499,269, filed on Jun. 21, 2011.

(51) Int. Cl.
C23C 16/455 (2006.01)
F17D 1/00 (2006.01)

(52) U.S. Cl.
CPC ......... C23C 16/455 (2013.01); C23C 16/45565 (2013.01); F17D 1/00 (2013.01); *Y10T 137/8593* (2015.04)

(58) Field of Classification Search
CPC ............ C23C 16/455; C23C 16/45565; Y10T 137/8593; F17D 1/00
See application file for complete search history.

(56) References Cited

U.S. PATENT DOCUMENTS

| | | | |
|---|---|---|---|
| 6,155,198 A * | 12/2000 | Danek et al. | 118/723 E |
| 6,308,654 B1 * | 10/2001 | Schneider et al. | 118/723 I |
| 2002/0170677 A1 * | 11/2002 | Tucker et al. | 156/345.48 |
| 2006/0051966 A1 * | 3/2006 | Or et al. | 438/706 |
| 2006/0162661 A1 * | 7/2006 | Jung et al. | 118/723 ER |
| 2007/0205101 A1 * | 9/2007 | Ye et al. | 204/298.12 |
| 2007/0235821 A1 * | 10/2007 | Clark | 257/411 |
| 2008/0099146 A1 * | 5/2008 | Keller | 156/345.34 |
| 2011/0115378 A1 * | 5/2011 | Lubomirsky et al. | 315/111.21 |
| 2012/0325149 A1 * | 12/2012 | Nguyen et al. | 118/724 |

\* cited by examiner

Primary Examiner — Jeffrie R Lund
(74) Attorney, Agent, or Firm — Moser Taboada; Alan Taboada

(57) ABSTRACT

In some embodiments, a gas distribution system may include a body disposed within a through hole formed in a process chamber body, the body comprising an opening, wherein an outer surface of the body is disposed a first distance from an inner surface of the through hole to form a first gap; a flange disposed proximate a first end of the body, the flange having an outer dimension greater than an inner dimension of the through hole; a showerhead disposed proximate a second end of the body opposite the first end and extending outwardly from the body to overlap a portion of the process chamber body, the showerhead configured to allow a flow of gas to an inner volume of the process chamber, wherein an outer surface of the showerhead is disposed a second distance from an inner surface of the process chamber body to form a second gap.

14 Claims, 2 Drawing Sheets

GAS DISTRIBUTION SYSTEM

CROSS-REFERENCE TO RELATED APPLICATIONS

This application claims benefit of U.S. provisional patent application Ser. No. 61/499,269, filed Jun. 21, 2011, which is herein incorporated by reference in its entirety.

FIELD

Embodiments of the present invention generally relate to semiconductor processing equipment.

BACKGROUND

In conventional gas distribution systems utilizing solid state or liquid gas precursors, gas supply lines are heated to prevent the precursor from condensing within the gas supply line. However, the inventors have observed that in conventional gas distribution systems one or more cold spots may be created due to the mass of the gas distribution system components (e.g. such as a showerhead), causing condensation of the precursor within the components of the gas distribution system. To prevent condensation of the precursor, the gas distribution system may be heated via heat transferred from various process chamber components (e.g., gas supply line, internal heaters such as heater, process chamber surfaces such as the lid or walls, or the like). However, the inventors have further observed that heat transferred from the various process chamber components may cause the gas distribution system to be heated to a temperature that causes the precursor to decompose.

Accordingly, the inventors have provided an improved gas distribution system.

SUMMARY

Apparatus for distributing gas to an inner volume of a process chamber are provided herein. In some embodiments, a gas distribution system may include a body disposed within a through hole formed in a process chamber body, the body comprising an opening configured to allow a flow of a gas through the body, wherein an outer surface of the body is disposed a first distance from an inner surface of the through hole to form a first gap between the outer surface of the body and the inner surface of the through hole; a flange disposed proximate a first end of the body, the flange extending outwardly and having an outer dimension greater than an inner dimension of the through hole; a showerhead disposed proximate a second end of the body opposite the first end and extending outwardly from the body to overlap at least a portion of the process chamber body, the showerhead configured to allow a flow of gas from the body to an inner volume of the process chamber, wherein an outer surface of the showerhead is disposed a second distance from an inner surface of the process chamber body to form a second gap between the outer surface of the showerhead and the inner surface of the process chamber body.

In some embodiments, a gas distribution system may include a process chamber having a substrate support; a heater disposed in the process chamber to control a temperature within the process chamber; and a gas distribution system coupled to the process chamber. The gas distribution system may include a body disposed within a through hole formed in a process chamber body, the body comprising an opening configured to allow a flow of a gas through the body, wherein an outer surface of the body is disposed a first distance from an inner surface of the through hole to form a first gap between the outer surface of the body and the inner surface of the through hole; a gas supply coupled to the opening of the body and configured to vaporize a solid state or liquid state precursor to form the gas; a flange disposed proximate a first end of the body, the flange extending outwardly and having an outer dimension greater than an inner dimension of the through hole; a showerhead disposed proximate a second end of the body opposite the first end and extending outwardly from the body to overlap at least a portion of the process chamber body, the showerhead configured to allow a flow of gas from the body to an inner volume of the process chamber, wherein an outer surface of the showerhead is disposed a second distance from an inner surface of the process chamber body to form a second gap between the outer surface of the showerhead and the inner surface of the process chamber body.

In some embodiments, a gas distribution system may include a first body disposed within a through hole formed in a process chamber body, the first body comprising an opening configured to allow a flow of a gas through the body, wherein an outer surface of the body is disposed a first distance from an inner surface of the through hole to form a first gap between the outer surface of the body and the inner surface of the through hole; a flange disposed proximate a first end of the body, the flange extending outwardly and having an outer dimension greater than an inner dimension of the through hole; a second body disposed proximate a second end of the first body opposite the first end and extending outwardly from the second body to overlap at least a portion of the process chamber body, the second body having an inner volume fluidly coupled to the opening of the first body and one or more gas distribution holes disposed through the second body to couple the inner volume to a processing volume of the process chamber, wherein an outer surface of the second body is disposed a second distance from an inner surface of the process chamber body to form a second gap between the outer surface of the showerhead and the inner surface of the process chamber body.

In some embodiments, a gas distribution system for a process chamber may include a body having an opening disposed through the body to allow a flow of a gas therethrough, wherein the body has a first width; a flange disposed proximate a first end of the body, wherein the flange extends outwardly from the body and has a second width that is greater than the first width; and a showerhead coupled to the body proximate a second end of the body opposite the first end, wherein the showerhead has a third width that is greater than the first width of the body, and wherein the showerhead includes an inner volume fluidly coupled to the opening of the body on a first side of the showerhead and one or more gas distribution holes disposed through the showerhead on a second side of the showerhead opposite the first side.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
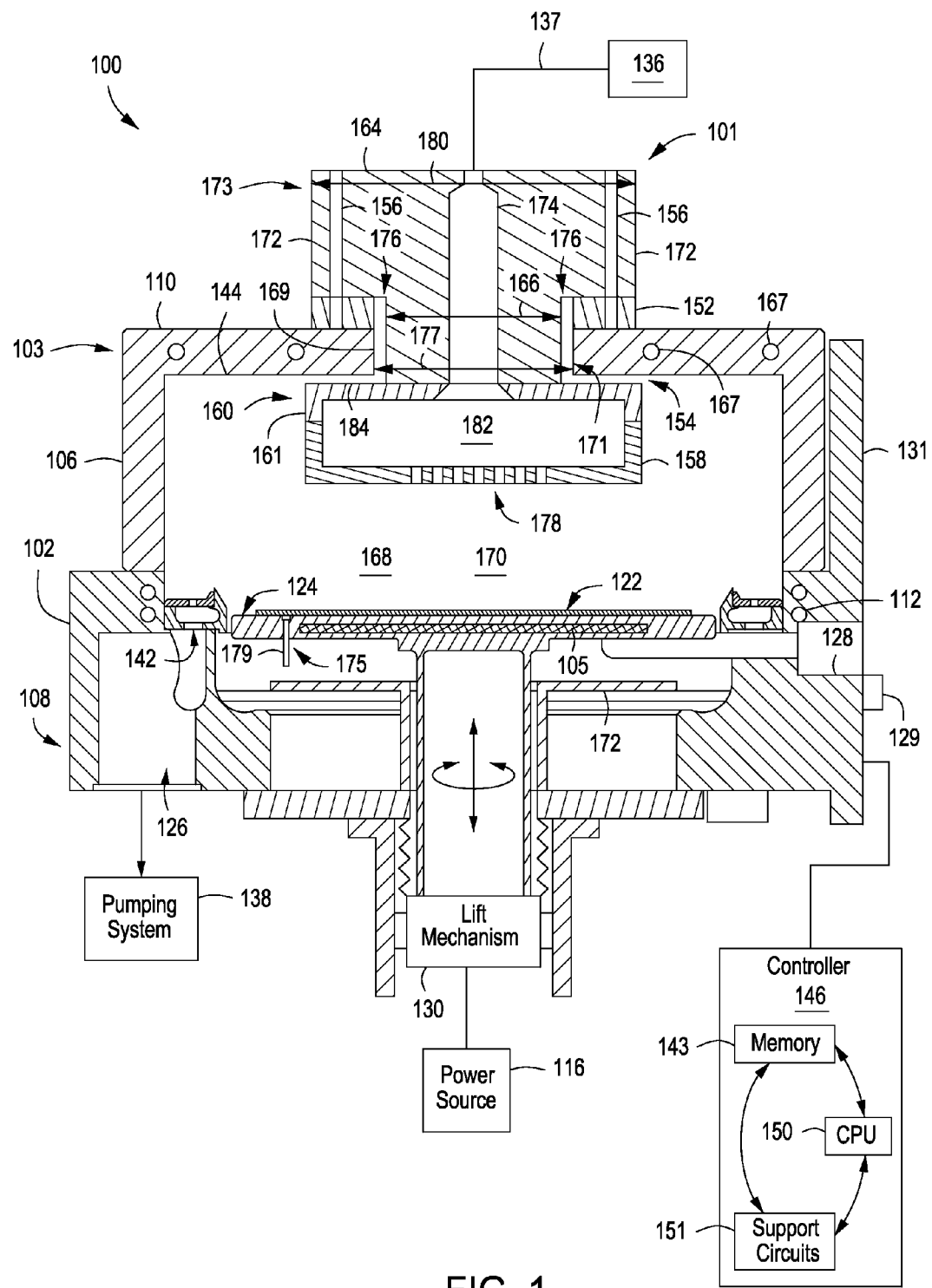
FIG. 1 depicts a process chamber suitable for use with a gas distribution system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present invention provide a gas distribution system suitable for use with process chambers utilizing precursors in a solid or gaseous state. The inventive gas distribution system advantageously minimizes thermal coupling between process chamber components and the gas delivery system, thereby reducing or eliminating condensation and/or decomposition of precursors within the gas distribution system.

FIG. 1 depicts a schematic, cross sectional view of a process chamber 100 suitable for use with a gas distribution system 101 in accordance with some embodiments of the present invention. The process chamber 100 may be any type of chamber utilizing a gas distribution system, for example a deposition chamber such as a chemical vapor deposition (CVD) chamber, a low pressure CVD (LPCVD) chamber, or the like. Examples of suitable CVD chambers include chambers found in the CENTURA®, ENDURA® and PRODUCER® line of process chambers commercially available from Applied Materials, Inc., of Santa Clara, Calif. Other process chambers from Applied Materials, Inc. or other manufacturers may also benefit from the inventive apparatus disclosed herein.

In some embodiments, the process chamber 100 may generally comprise a chamber body 103 defining an inner volume 168 that may include a processing volume 170. In some embodiments, the chamber body 103 may comprise a multiple piece construction, for example having an upper assembly 106 and lower assembly 102. The processing volume 170 maybe defined, for example, between a substrate support 124 for receiving a substrate 122 disposed within the process chamber 100 and an inner surface 144 of a lid 110 of the process chamber 100. The gas distribution system 101 is coupled to the chamber body 103 and configured to provide one or more process gases from a gas supply 136 to the inner volume 168.

In some embodiments, the substrate support 124 may include a mechanism that retains or supports the substrate 122 on the surface of the substrate support 124, such as an electrostatic chuck, a vacuum chuck, a substrate retaining clamp, or the like. Alternatively, or in combination, in some embodiments, the substrate support 124 may include mechanisms for controlling the substrate temperature (such as heating and/or cooling devices, and/or for controlling the species flux and/or ion energy proximate the substrate surface. For example, in some embodiments, the substrate support 124 may include a heating element 105 embedded within the substrate support 124 and coupled to a power source 116 to provide backside heating of the substrate 122 during processing.

The substrate 122 may enter the process chamber 100 via an opening 128 in a wall 131 of the process chamber 100. The opening 128 may be selectively sealed via a slit valve 129, or other mechanism for selectively providing access to the interior of the process chamber 100 through the opening 128. The substrate support 124 may be coupled to a lift mechanism 130 that may control the position of the substrate support 124 between a lower position suitable for transferring substrates into and out of the chamber via the opening 128 and a selectable upper position suitable for processing. The process position may be selected to maximize process uniformity for a particular process. When in at least one of the elevated processing positions, the substrate support 124 may be disposed above the opening 124 to provide a symmetrical processing region.

In some embodiments, a lift plate 172 may be disposed beneath the substrate support 124 and configured to interface with one or more lift pins (one lift pin 179 shown) to facilitate removal of the substrate 122 from the substrate support 122 and/or the process chamber 100. In such embodiments, the substrate support 124 may comprise one or more lift pin holes 175 configured to allow the lift pins 179 to move through the substrate support 124. In operation, the lift mechanism 130 may lower the substrate support 124, causing the lift pins 179 to interface with the lift plate 172. The lift pins 179 move vertically through the lift pins holes 175 and lift the substrate 122 from the substrate support 124, thereby allowing it to be removed via the opening 128.

In some embodiments, the process chamber 100 may comprise one or more mechanisms to facilitate control over the temperature and/or provide temperature uniformity within the inner volume 168 of the process chamber 100. For example, in some embodiments, one or more walls (e.g., wall 131) of the process chamber 100 may be thermally regulated. In such embodiments, a plurality of conduits 112 may be disposed in the one or more walls and configured to circulate a heat transfer fluid regulating the temperature of the wall. Alternatively, or in combination, in some embodiments, a heater (not shown) may be disposed proximate the substrate support 124. The heater may be any type of heater suitable to heat the inner volume 168 of the process chamber, for example such as a ceramic heater or the like.

In some embodiments, the process chamber 100 may include an exhaust system 108 for evacuating gases and/or maintaining a desired pressure within the inner volume 168 of the process chamber 100. The exhaust system 108 may generally comprise a vacuum pump 138 coupled to a pumping port 126 of the process chamber 100. In some embodiments, the exhaust system 108 may comprise other components (not shown in FIG. 1) to facilitate evacuating or maintaining a desired pressure in the process chamber, for example, such as valves, a foreline, or the like. In some embodiments, gases flowing out of the process chamber 100 may be routed through a pumping ring 142 to enhance gas flow uniformity across the surface of the substrate 122.

In some embodiments, a controller 146 may be provided and coupled to various components of the process chamber 100 to control the operation of the various components. The controller 146 includes a central processing unit (CPU) 150, a memory 143, and support circuits 151. The controller 146 may control the process chamber 100 directly, or via computers (or controllers) associated with particular process chamber and/or support system components. The controller 146 may be one of any form of general-purpose computer processor that can be used in an industrial setting for controlling various chambers and sub-processors. The memory, or computer readable medium, 143 of the controller 146 may be one or more of readily available memory such as random access memory (RAM), read only memory (ROM), floppy disk, hard disk, optical storage media (e.g., compact disc or digital video disc), flash drive, or any other form of digital storage, local or remote. The support circuits 151 are coupled to the CPU 150 for supporting the processor in a conventional manner. These circuits include cache, power supplies, clock circuits, input/output circuitry and subsystems, and the like.

The gas supply 136 supplies the gas distribution system 101 with one or more one or more process gases to be distributed to the process chamber 100. The gas supply 136 may be any type of gas supply suitable to provide one or more desired process gases in accordance with a particular process or process chamber. In some embodiments, the gas supply 136 may comprise a solid or liquid state precursor that is vaporized and provided to the gas delivery system 101 via a gas supply line 137. The precursor may be any precursor, for example such as a cerium (Ce) containing solid state precursor.

In embodiments where the gas supply 136 comprises a solid, liquid, or vapor state precursor, the inventors have observed that the gas supply line 137 must be heated to a minimum temperature (e.g., great than about 140 degrees Celsius (C)) to avoid condensation of the precursor within the gas supply line 137. For example, in some embodiments, the gas supply line 137 may be heated to a temperature of about 140 to about 200 degrees Celsius, or about 180 degrees Celsius. However, the inventors have observed that in conventional gas distribution systems one or more cold spots may be created due to heat transfer to other components of the gas distribution system or to other components of the process chamber. The cold spots may cause condensation of the precursor within the components of the gas distribution system. To prevent condensation of the precursor, the gas distribution system may be heated via heat transferred from various process chamber components (e.g., gas supply line 137, internal heaters, process chamber surfaces such as the lid 110 or walls 131, or the like). However, the heat transferred from the various process chamber components may cause the gas distribution system to be heated to a temperature (e.g., greater than about 200 degrees C.) that causes the precursor to decompose. The inventors have discovered that by minimizing thermal coupling between the heated gas supply line 137 and/or process chamber components and the gas delivery system 101, condensation and/or decomposition of the precursor provided to the process chamber 100 may be reduced or eliminated.

In some embodiments, the gas distribution system 101 may generally comprise a first body 164 having an opening 174 configured to allow a flow of a gas through the body 164, a flange 172 disposed proximate a first end 173 of the body 164 and a second body 160 disposed proximate a second end 171 of the first body 164 opposite the first end 173. The gas distribution system 101 may be fabricated from any suitable material for example, such as a metal (e.g., aluminum, anodized aluminum, stainless steel, or the like), a ceramic, (e.g., aluminum oxide ($Al_2O_3$)), or the like. In some embodiments, the gas distribution system 101 may be fabricated from aluminum, such as 6061-T6. In some embodiments, the first body 164, flange 172 and second body 160 may be fabricated from the same material, or in some embodiments, a different material.

The first body 164 may be disposed within a through hole 169 formed in the chamber body 103. The through hole 169 may be formed in any portion of the chamber body 103 suitable to position the gas distribution system 101 in a desired location suitable to accommodate for various process chamber configurations. For example, in some embodiments, the through hole 169 may be formed in a wall (e.g. wall 131) of the chamber body 103. Alternatively, in some embodiments, the through hole 169 may be formed in the lid 110 of the chamber body 103, such as depicted in FIG. 1.

In some embodiments, to facilitate thermally isolating the gas distribution system 101 from the chamber body 103, the first body 164 may comprise dimensions suitable to form a gap (i.e., first gap 176) between surfaces of the first body 164 and the chamber body 103. For example, in some embodiments, the first body 164 may have an outer dimension 166 (e.g., a first width) less than that of an inner dimension 177 of the through hole 169 to form the first gap 176. In some embodiments, the first gap may be unfilled. In some embodiments, the first gap may be filled with a material having a low thermal conductivity (e.g., having a thermal conductivity of less than about 0.9 W/(mK)) to provide a limited heat transfer between the chamber body 103 and the gas distribution system 101. For example, in some embodiments, the low conductivity material may be fiberglass reinforced polyether ether ketone (PEEK).

The flange 172 extends outwardly from the first body 164 and comprises an outer dimension 180 (e.g., a second width) greater than the inner dimension 177 of the through hole 169 to overlap at least a portion of the chamber body 103 and facilitate coupling the gas distribution system 101 to the chamber body 103. In some embodiments, a thermal isolator 152 may be disposed between the flange 172 and chamber body 103 to facilitate thermally isolating the gas distribution system 101 from the chamber body 103 (e.g., substantially reducing the rate of heat transfer between the flange 172 and the chamber body 103). The thermal isolator 152 may comprise any material suitable to limit a transfer of heat between the flange 172 and the lid 110, for example such as fiberglass reinforced PEEK or the like. In some embodiments, one or more through holes 156 may be formed in the flange 172 (and thermal isolator 152, when present) to facilitate securing the gas distribution system 101 to the chamber body 103. In addition, the thermal insulator 152 and the flange 172 provide a vacuum tight seal to preserve the vacuum integrity of the process volume 170.

The second body 160 comprises an inner volume 182 fluidly coupled to the opening 174 of the first body 164 and one or more gas distribution holes 178 to couple the inner volume 182 to a processing volume 170 of the process chamber 100 to allow a flow of gas from the opening 174 of the first body 164 to the processing volume 170. The one or more gas distribution holes 178 may comprise any size, geometry, number, and location to facilitate a desired pattern of gas/vapor flow to the processing volume 170. In some embodiments, the second body 160 may be a single piece construction showerhead. Alternatively, in some embodiments, the second body 160 may comprise a multi-piece construction having a showerhead 158 coupled to the first body 164, for example, via a mounting flange 161. In such embodiments, the one or more gas distribution holes 178 may be disposed within the showerhead 158.

In some embodiments, to facilitate thermally isolating the gas distribution system 101 from the chamber body 103, the second body 160 may be configured to extend outwardly from the first body 164 to overlap at least a portion of the chamber body 103 and disposed such that a second gap 154 is formed between an outer surface 184 of the second body 160 and an inner surface 144 of the chamber body 103. In some embodiments, the second gap 154 may be fluidly coupled to the first gap 176. In some embodiments, the second gap 154 may be unfilled. In some embodiments, the second gap 154 may be filled with a material having a low thermal conductivity (e.g., having a thermal conductivity of less than about 0.9 W/(mK)) to provide a limited heat transfer between the chamber body 103 and the gas distribution system 101. In some embodiments, where process pressures are expected to operate below about 1 Torr, the gap 154 may be unfilled by any material. As expected process pressures increase beyond about 1 Torr, a suitable filling material may be chosen to inhibit heat transfer to the chamber walls. In embodiments where the second gap 154 is filled with a material having a low thermal conductivity, the material may be the same, or in some embodiments different, than the material used to fill the first gap 176.

In some embodiments, to further limit a transfer of heat from the chamber body 103 to the gas distribution system 101, the process chamber 100 may comprise one or more conduits configured to circulate a heat transfer fluid disposed within the chamber body 103 proximate the gas distribution system 101. For example, in some embodiments, one or more conduits 167 may be disposed within the lid 110.

Figure 2:
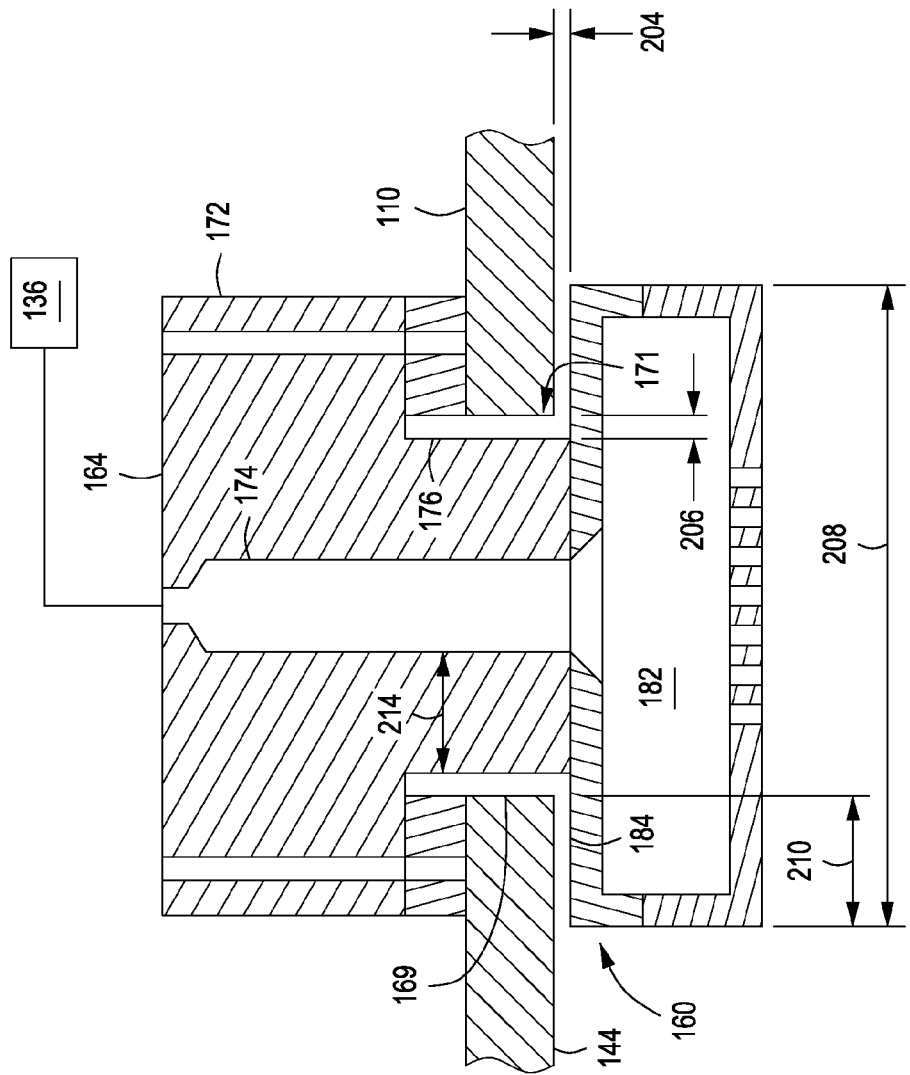
FIG. 2 is a gas distribution system in accordance with some embodiments of the present invention.

Referring to FIG. 2, in some embodiments, the amount of heat transferred between the gas distribution system 101 and the chamber body 103 may be controlled by varying the dimensions of the components of the gas distribution system 101 (e.g., first body 164, second body 160 and flange 172) and/or size of the first gap 176 and second gap 154.

For example, in some embodiments, by increasing the width 208 of the second body 160 the amount of overlap 210 between the second body 160 and the lid 110 increases, creating a larger adjacent surface area between the second body 160 and the lid 110, thus allowing for a higher amount of heat transfer between the second body 160 and the lid 110. In some embodiments, the size of the width 208 of the second body 160 may be between about 4 to about 13 inches, or about 6.90 to about 7.40 inches, for example, for use with 200 mm wafers. Accordingly, in some embodiments, the overlap 210 between the second body 160 and the lid 110 may be between about 0.85 inches to about 1.10 inches, or about 2 to about 7 inches, for use with 200 mm wafers. The above dimensions may be scaled accordingly for different substrate sizes.

In some embodiments, by controlling the wall thickness of the first body 164 and/or flange 172, the heat transfer between the gas distribution system 101 and the lid 110 may be controlled (e.g., greater overlap leads to increased heat transfer and vice versa). In some embodiments, a wall thickness 214 of the first body 164 may be about 1.20 to about 1.60 inches.

In some embodiments, the wall thickness 214 may be increased or decreased to control a temperature gradient between the second body 160 and the first body 164. The size of the opening 174 may be varied to accomplish this, or the inner volume 182 may be modified to accommodate an increase in wall thickness 214. This will allow an increase in heat transfer from the second body 160 to the first body 164, thus reducing the total temperature gradient in the entire assembly.

In some embodiments, by increasing the size of the first gap 176 (e.g., width 206) and/or the second gap 154 (e.g., width 204) the heat transfer between the gas distribution system 101 and the lid 110 may decrease. For example, in some embodiments, the first gap 176 and second gap 154 may have a width of about 0.100 inches to about 0.150 inches, or about 0.100 inches. In some embodiments, the size of the first gap 176 may be the same, or in some embodiments, different than the size of the second gap 154.

Thus, a gas distribution system has been provided herein. The inventive gas distribution system advantageously minimizes thermal coupling between process chamber components and the gas delivery system, and further advantageously increases the heat transfer between the bottom and the top of the gas delivery system, thereby reducing or eliminating condensation and/or decomposition of precursors within the gas distribution system.

While the foregoing is directed to embodiments of the present invention, other and further embodiments of the invention may be devised without departing from the basic scope thereof.

The invention claimed is:

1. A gas distribution system for a process chamber, comprising:
   a body disposed within a through hole formed in a lid of the process chamber, the body comprising an opening configured to allow a flow of a gas through the body, wherein an outer surface of the body is disposed a first distance from an inner surface of the through hole to form a first thermal isolation gap between the outer surface of the body and the inner surface of the through hole, and wherein the first thermal isolation gap is unfilled;
   a flange disposed proximate a first end of the body, the flange extending outwardly from the body and having an outer dimension greater than an inner dimension of the through hole, wherein the flange supports the body of the gas distribution system on the lid of the process chamber; and
   a showerhead disposed proximate a second end of the body opposite the first end and extending outwardly from the body to overlap at least a portion of the lid of the process chamber, the showerhead configured to allow a flow of gas from the body to an inner volume of the process chamber, wherein an outer surface of a top portion of the showerhead is disposed a second distance from an inner surface of the lid of the process chamber to form a second thermal isolation gap between the outer surface of the top portion of the showerhead and the inner surface of the lid of the process chamber, and wherein the second thermal isolation gap is unfilled.

2. The gas distribution system of claim 1, further comprising:
   a thermal insulator disposed between the flange and an outer surface of the lid of the process chamber.

3. The gas distribution system of claim 1, wherein the showerhead further comprises:
   a mounting flange disposed adjacent to the second end of the body to couple the showerhead to the body.

4. The gas distribution system of claim 1, wherein the first thermal isolation gap and second thermal isolation gap have a width of about 0.100 to about 0.150 inches.

5. The gas distribution system of claim 1, further comprising:
   a gas supply coupled to the opening of the body and configured to vaporize a solid state or liquid state precursor to form the gas.

6. The gas distribution system of claim 5, wherein the solid state precursor comprises cerium.

7. The gas distribution system of claim 1, wherein the process chamber is a low pressure chemical vapor deposition (LPCVD) chamber.

8. The gas distribution system of claim 1, wherein the lid comprises one or more conduits disposed within the lid and configured to circulate a heat transfer fluid through the lid.

9. A gas distribution system, comprising:
   a process chamber having a substrate support and;
   a heater disposed in the process chamber to control a temperature within the process chamber; and
   a gas distribution system coupled to the process chamber, comprising:

a body disposed within a through hole formed in a lid of the process chamber, the body comprising an opening configured to allow a flow of a gas through the body, wherein an outer surface of the body is disposed a first distance from an inner surface of the through hole to form a first thermal isolation gap between the outer surface of the body and the inner surface of the through hole, and wherein the first thermal isolation gap is unfilled;

a gas supply coupled to the opening of the body and configured to vaporize a solid state or liquid state precursor to form the gas;

a flange disposed proximate a first end of the body, the flange extending outwardly from the body and having an outer dimension greater than an inner dimension of the through hole, wherein the flange supports the body of the gas distribution system on the lid of the process chamber; and a showerhead disposed proximate a second end of the body opposite the first end and extending outwardly from the body to overlap at least a portion of the lid of the process chamber, the showerhead configured to allow a flow of gas from the body to an inner volume of the process chamber, wherein an outer surface of a top portion of the showerhead is disposed a second distance from an inner surface of the lid of the process chamber to form a second thermal isolation gap between the outer surface of the top portion of the showerhead and the inner surface of the lid of the process chamber, and wherein the second thermal isolation gap is unfilled.

10. The gas distribution system of claim 9, further comprising:

a thermal insulator disposed between the flange and the lid of the process chamber.

11. The gas distribution system of claim 9, wherein the showerhead further comprises:

a mounting flange disposed adjacent to the second end of the body to couple the showerhead to the body.

12. The gas distribution system of claim 9, wherein the first thermal isolation gap and second thermal isolation gap have a width of about 0.100 to about 0.150 inches.

13. The gas distribution system of claim 9, wherein the lid comprises one or more conduits disposed in the lid to circulate a heat transfer fluid through the lid.

14. A gas distribution system for a process chamber, comprising:

a body disposed within a through hole formed in a lid of the process chamber, the body having an opening disposed through the body to allow a flow of a gas therethrough, wherein the body has a first width, wherein an outer surface of the body is disposed a first distance from an inner surface of the through hole to form a first thermal isolation gap between the outer surface of the body and the inner surface of the through hole, and wherein the first thermal isolation gap is filled with a material having a thermal conductivity of less than about 0.9 W/(mK);

a flange disposed proximate a first end of the body, wherein the flange extends outwardly from the body and has a second width that is greater than the first width, and wherein the flange supports the body of the gas distribution system on the lid of the process chamber; and a showerhead coupled to the body proximate a second end of the body opposite the first end, wherein the showerhead has a third width that is greater than the first width of the body, wherein the showerhead includes an inner volume fluidly coupled to the opening of the body on a first side of the showerhead and one or more gas distribution holes disposed through the showerhead on a second side of the showerhead opposite the first side, and wherein an outer surface of a top portion of the showerhead is disposed a second distance from an inner surface of the lid of the process chamber to form a second thermal isolation gap between the outer surface of a top portion of the showerhead and the inner surface of the lid of the process chamber, and wherein the second thermal isolation gap is filled with a material having a thermal conductivity of less than about 0.9 W/(mK).

* * * * *